(12) United States Patent
Cho (10) Patent No.: US 10,879,222 B2
(45) Date of Patent: Dec. 29, 2020

(54) POWER CHIP INTEGRATION MODULE, MANUFACTURING METHOD THEREOF, AND DOUBLE-SIDED COOLING POWER MODULE PACKAGE

(71) Applicant: HYUNDAI AUTRON CO., LTD., Seoul (KR)

(72) Inventor: Han Sin Cho, Seoul (KR)

(73) Assignee: HYUNDAI AUTRON CO., LTD., Seoul (KR)

( * ) Notice: Subject to any disclaimer, the term of this patent is extended or adjusted under 35 U.S.C. 154(b) by 0 days.

(21) Appl. No.: 16/203,354

(22) Filed: Nov. 28, 2018

(65) Prior Publication Data
US 2019/0181125 A1    Jun. 13, 2019

(30) Foreign Application Priority Data

Dec. 7, 2017  (KR) .......................... 10-2017-0167629

(51) Int. Cl.
| | | |
|---|---|---|
| *H01L 25/11* | (2006.01) | |
| *H01L 23/495* | (2006.01) | |
| *H01L 23/433* | (2006.01) | |
| *H01L 23/373* | (2006.01) | |
| *H01L 21/56* | (2006.01) | |

(Continued)

(52) U.S. Cl.
CPC .......... *H01L 25/115* (2013.01); *H01L 21/565* (2013.01); *H01L 23/3735* (2013.01); *H01L 23/4334* (2013.01); *H01L 23/4952* (2013.01); *H01L 23/49531* (2013.01); *H01L 23/49534* (2013.01); *H01L 23/49568* (2013.01); *H01L 23/051* (2013.01); *H01L 23/3107* (2013.01); *H01L 23/49575* (2013.01)

(58) Field of Classification Search
CPC ............. H01L 25/115; H01L 23/49531; H01L 23/4334; H01L 23/3735; H01L 21/565; H01L 23/4952; H01L 23/49534; H01L 23/49568; H01L 23/49575; H01L 23/051; H01L 23/3107; H01L 25/072; H01L 25/18
See application file for complete search history.

(56) References Cited

U.S. PATENT DOCUMENTS

2006/0151874 A1* 7/2006 Milich .................. H01L 25/072
                                                                    257/713
2013/0009298 A1* 1/2013 Ota ...................... H01L 23/3735
                                                                    257/676

(Continued)

*Primary Examiner* — Steven H Loke
*Assistant Examiner* — Juanita B Rhodes
(74) *Attorney, Agent, or Firm* — Morgan, Lewis & Bockius LLP (57) ABSTRACT

Provided is a power chip integration module including: a first semiconductor chip; a second semiconductor chip; a wiring layer on an upper surface or a lower surface of the first semiconductor chip and the second semiconductor chip to electrically connect the first semiconductor chip and the second semiconductor chip; an internal electrode extending from an internal electrode pad on an upper surface of at least one of the wiring layer, the first semiconductor chip, the second semiconductor chip, and combinations thereof to an external solder pad formed on an installation surface of the first semiconductor chip and the second semiconductor chip; and a first molding member in a shape to surround at least a portion of the first semiconductor chip, the second semiconductor chip, and the internal electrode.

11 Claims, 6 Drawing Sheets

(51) Int. Cl.
H01L 23/051 (2006.01)
H01L 23/31 (2006.01)

(56) References Cited

U.S. PATENT DOCUMENTS

| | | | | |
|---|---|---|---|---|
| 2013/0049137 A1* | 2/2013 | Uno | ........................ | H02M 1/32 |
| | | | | 257/401 |
| 2013/0256856 A1* | 10/2013 | Mahler | ................... | H01L 24/82 |
| | | | | 257/676 |
| 2014/0035112 A1* | 2/2014 | Kadoguchi | ............ | H01L 24/73 |
| | | | | 257/666 |
| 2015/0179539 A1* | 6/2015 | Tamai | ..................... | H01L 24/32 |
| | | | | 257/734 |
| 2016/0071778 A1* | 3/2016 | Otsubo | ................... | H01L 23/29 |
| | | | | 257/687 |
| 2016/0099198 A1 | 4/2016 | Wen | | |
| 2016/0343641 A1* | 11/2016 | Hori | ........................ | H01L 24/11 |

* cited by examiner

POWER CHIP INTEGRATION MODULE, MANUFACTURING METHOD THEREOF, AND DOUBLE-SIDED COOLING POWER MODULE PACKAGE

CROSS-REFERENCE TO RELATED APPLICATIONS

This U.S. non-provisional patent application claims priority to Korean Patent Application No. 10-2017-0167629, filed on Dec. 7, 2017, the entire contents of which are hereby incorporated by reference.

BACKGROUND

The present invention relates to a power chip integration module, a manufacturing method thereof, and a double-sided cooling power module package, and more particularly, to a power chip integration module capable of reducing the number of components during mounting as integrated chips are manufactured in advance and lowering the defect rate of the product, thereby greatly improving yield and productivity, a manufacturing method thereof, and a double-sided cooling power module package.

A power module for motor driving is used for environmentally friendly vehicles such as hybrid vehicles, electric vehicles, and fuel cell vehicles. In the case of an environmental vehicle, a permanent magnet motor is used as a motor driving means, and a motor is driven by a three-phase AC voltage through a pulse width modulation (PWM) signal.

After a plurality of semiconductor chips are mounted on a paddle, which is a chip mounting area in a lead frame, the chips and the lead frame are electrically interconnected using wiring, and sealed with a sealing member such as an Epoxy Molding Compound (EMC), so that generally, a power module package may have a structure to protect the inside.

However, such conventional power module packages have many problems. For example, since the number of components to be mounted at the time of mounting is so large, a mounting time and a mounting cost are consumed greatly. In addition, since a separate jig is required for each mounting step, much time and manpower are consumed for installing and stacking the jig. Moreover, the chips are damaged during the process of separating the jig after soldering.

Further, there are problems that the wire becomes denser or lengthened in the trend of thinning the package thickness in order to improve the thermal resistance characteristic, thereby causing a wire short-circuit phenomenon or increasing a switching loss due to a high parasitic inductance.

In addition, in relation to the power module package of the double-sided cooling type, since the metal layer is formed directly on the chip, there are problems that the thermal stress is concentrated on the chip in the thermal shock test and the chip is damaged.

SUMMARY

The present invention is to provide a power chip integration module, a manufacturing method thereof, and a double-sided cooling power module package. In relation to the power chip integration module, by integrating a plurality of semiconductor chips into a single module, it is possible to reduce the number of components in mounting and reduce the mounting time and the mounting cost. In addition, since a separate jig is not required for each mounting step, the time and manpower consumed for installing or stacking the jig may be reduced and the integration module may be protected in a package form to improve the durability and strength of the product. Further, since the integration module, which is verified in the form of a package, may be finally assembled, productivity may be increased by improving module assembly yield, and wiring layers or metal layers on the chips may dissipate thermal and physical stresses. Moreover, it is possible to prevent the short-circuit phenomenon and the parasitic inductance by the existing wire, thereby improving the switching efficiency, and it is possible to improve thermal resistance characteristics by using an integral spacer. However, these problems are illustrative, and the scope of the present invention is not limited thereto.

An embodiment of the inventive concept provides a power chip integration module including: a first semiconductor chip; a second semiconductor chip; a wiring layer disposed on an upper surface or a lower surface of the first semiconductor chip and the second semiconductor chip to electrically connect the first semiconductor chip and the second semiconductor chip; an internal electrode extending from an internal electrode pad on an upper surface of at least one of the wiring layer, the first semiconductor chip, the second semiconductor chip, and combinations thereof to an external solder pad on an installation surface of the first semiconductor chip and the second semiconductor chip; and a first molding member in a shape to surround at least a portion of the first semiconductor chip, the second semiconductor chip, and the internal electrode.

In an embodiment, the internal electrode may include: a horizontal portion disposed horizontally along an upper surface of any one of the wiring layer, the first semiconductor chip, and the second semiconductor chip; and a vertical portion extending from the horizontal portion to the solder pad in a vertical direction.

In an embodiment, in order to serve as a heat transfer path above at least one of the wiring layer, the first semiconductor chip, the second semiconductor chip, and combinations thereof, the first molding member may be provided with a through-window portion for exposing an upper surface of at least one of the wiring layer, the first semiconductor chip, and the second semiconductor chip.

In an embodiment, a solder or a solder paste may be applied to at least a portion of the solder pad, the wiring layer, and the first semiconductor chip or the second semiconductor chip.

In an embodiment, the first semiconductor chip may be an insulated gate bipolar transistor (IGBT), and the second semiconductor chip may be a diode.

In an embodiment of the inventive concept, provided is a manufacturing method of a power chip integration module. The method includes: disposing a first semiconductor chip and a second semiconductor chip on an installation surface; primarily molding a portion of a first molding member in a shape surrounding a side surface of the first semiconductor chip and the second semiconductor chip; forming a vertical portion of an internal electrode by perforating the portion of the molded first molding member and using a metal process on the perforated portion; forming a horizontal portion of the internal electrode so as to be connected to the vertical portion and forming a wiring layer for electrically connecting an upper surface of the first semiconductor chip and an upper surface of the second semiconductor chip; secondarily molding the remaining portion of the first molding member except the horizontal portion of the internal electrode and a heat transfer path; and applying a solder or a solder paste to at least a portion of the solder pad P2 exposed to the outside and the wiring layer and the first semiconductor chip or the second semiconductor chip.

In an embodiment of the inventive concept, a double-sided cooling power module package includes: a lower substrate; a lead frame disposed on the lower substrate; a power chip integration module disposed on the lead frame and integrated with the first semiconductor chip and the second semiconductor chip to enable soldering without wiring; an upper substrate disposed on the power chip integration module; and a second molding member disposed between the lower substrate and the upper substrate, wherein the power chip integration module includes: a first semiconductor chip; a second semiconductor chip; a wiring layer disposed on an upper surface or a lower surface of the first semiconductor chip and the second semiconductor chip to electrically connect the first semiconductor chip and the second semiconductor chip; an internal electrode extending from an internal electrode pad on an upper surface of at least one of the wiring layer, the first semiconductor chip, the second semiconductor chip, and combinations thereof to an external solder pad on an installation surface of the first semiconductor chip and the second semiconductor chip; and a first molding member in a shape to surround at least a portion of the first semiconductor chip, the second semiconductor chip, and the internal electrode.

In an embodiment, the upper substrate may include: an upper insulating substrate; a first upper metal layer disposed on an upper surface of the upper insulating substrate; a second upper metal layer disposed on a lower surface of the upper insulating substrate; and a spacer portion disposed between the second upper metal layer and the power chip integration module.

In an embodiment, the second upper metal layer and the spacer portion may be integrally formed through an etching process so that the spacer portion may protrude from the second upper metal layer.

In an embodiment, the lead frame may include: a paddle portion on which the first semiconductor chip and the second semiconductor chip are mounted; and a lead portion electrically connected to the first semiconductor chip and the second semiconductor chip by the internal electrode of the power chip integration module.

In an embodiment, the lower substrate may include: a lower insulating substrate; a first lower metal layer disposed on an upper surface of the lower insulating substrate; and a second lower metal layer disposed on a lower surface of the lower insulating substrate, wherein the first lower metal layer may be patterned to correspond to the power chip integration module.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Hereinafter, embodiments of the present invention will be described in detail with reference to the accompanying drawings.

Embodiments of the present invention are provided to more fully describe the present invention to those skilled in the art, and the following embodiments may be modified in various forms, and the scope of the present invention is not limited to the following embodiments. Rather, these embodiments are provided so that this disclosure will be more thorough and complete, and will fully convey the scope of the invention to those skilled in the art. In addition, in the drawings, the thickness and size of each layer are exaggerated for convenience and clarity of explanation.

The terms used in this specification are used only for explaining specific embodiments and are not intended to limit the present invention. As used herein, unless the context clearly indicates otherwise, the singular forms may include plural forms. Also, as used herein, "comprise" and/or "comprising" specify the presence of the stated forms, numbers, steps, operations, elements, elements, and/or groups, and do not exclude the presence or addition of one or more other forms, numbers, steps, operations, elements, elements, and/or groups.

Hereinafter, embodiments of the present invention will be described with reference to the drawings schematically showing ideal embodiments of the present invention. In the drawings, for example, variations in the shape shown may be expected, depending on the manufacturing technique and/or tolerance. Therefore, embodiments of the present invention should not be construed as limited to any particular shape of the regions shown herein but, for example, should include changes in shape resulting from manufacturing.

Hereinafter, a power chip integration module, a manufacturing method thereof, and a double-sided cooling power module package according to various embodiments of the present invention will be described in detail with reference to the drawings.

Figure 1:
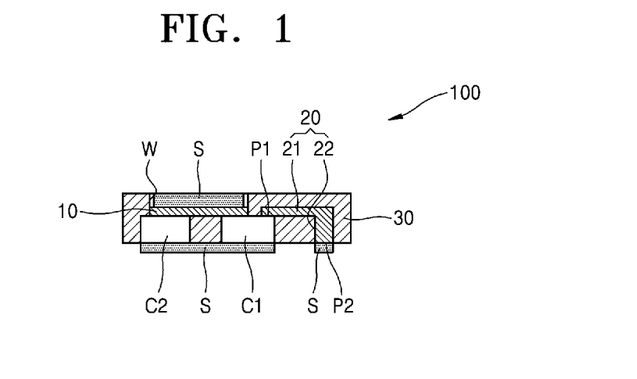
FIG. 1 is a cross-sectional view illustrating a power chip integration module according to some embodiments of the present invention.

FIG. 1 is a cross-sectional view illustrating a power chip integration module 100 according to some embodiments of the present invention.

First, as shown in FIG. 1, the power chip integration module 100 according to some embodiments of the present invention includes a first semiconductor chip C1, a second semiconductor chip C2, a wiring layer 10, an internal electrode 20, and a first molding member 30.

For example, the first semiconductor chip C1 is a chip manufactured using a semiconductor process in which elements or circuits necessary for driving motors and other electronic components are integrated, and more specifically, for example, it may be a functional element formed in a structure in which at least one active element or passive elements are compactly integrated and may not be separated from each other.

In addition, for example, the second semiconductor chip C2 is also a chip manufactured using a semiconductor process in which elements or circuits necessary for driving motors and other electronic components are integrated, and more specifically, for example, it may be a functional element formed of at least one active element or at least one passive element.

More specifically, for example, in order to construct a power chip, the first semiconductor chip C1 may be an insulated gate bipolar transistor (IGBT), and the second semiconductor chip C2 may be a diode.

For example, when the first semiconductor chip C1 is an IGBT, an emitter electrode and a gate electrode may be formed on one surface or the other surface, and a collector electrode may be formed on the other surface or one surface.

Also, when the second semiconductor chip C2 is a diode, a positive electrode may be formed on one surface or the other surface, and a negative electrode may be formed on the other surface or one surface.

When the electrodes are formed on both surfaces of the first semiconductor chip C1 and the second semiconductor chip C2, the wiring layer 10 described above may be formed on both surfaces of the first semiconductor chip C1 and the second semiconductor chip C2. However, the present invention is not limited to this, and the electrodes may be formed on only one surface of the first semiconductor chip C1 and the second semiconductor chip C2. In this case, as shown in FIG. 1, the wiring layer 10 may be formed on the first semiconductor chip C1 and the second semiconductor chip C2.

For example, as shown in FIG. 1, in order to electrically connect the first semiconductor chip C1 and the second semiconductor chip C2, the wiring layer 10 may be a conductive metal thin film or a circuit board formed on the first semiconductor chip C1 and the second semiconductor chip C2.

Also, for example, as shown in FIG. 1, at least a portion of the internal electrode 20 may be protected without being exposed to the outside by the first molding member 30, and the internal electrode 20 may be an electrode structure extending from the internal electrode pad P1 formed on the upper surface of at least one of the wiring layer 10, the first semiconductor chip C1, the second semiconductor chip C2, and combinations thereof to the external solder pad P2 formed on the installation surface F of the first semiconductor chip C1 and the second semiconductor chip C2.

The internal electrode 20 may be formed using a kind of through-hole electrode process or a wiring process that may replace the wire. For example, the internal electrode 20 may be formed by forming a through hole to be described later in the first molding member 30 and filling a metal layer in the through hole. However, the present invention is not limited to this, and the internal electrode 20 may be formed by a variety of methods such as forming it by soldering a finished product or an internal lead frame.

More specifically, for example, the internal electrode 20 includes a horizontal portion 21 formed horizontally along an upper surface of any one of the wiring layer 10, the first semiconductor chip C1, and the second semiconductor chip C2, and a vertical portion 22 formed to extend in the vertical direction from the horizontal portion 21 to the solder pad.

Here, for example, the horizontal portion 21 may use a thick-film metal process, and the vertical portion 22 may use a through-hole electrode process.

Meanwhile, for example, as shown in FIG. 1, the first molding member 30 may be a kind of primary packaging member that is a resin compound material formed in a shape that primarily surrounds at least a portion of the first semiconductor chip C1, the second semiconductor chip C2, and the internal electrode 20.

More specifically, for example, in order to serve as a heat transfer path above at least one of the wiring layer 10, the first semiconductor chip C1, the second semiconductor chip C2, and combinations thereof, the first molding member 30 is provided with a through-window portion W for exposing the upper surface of at least one of the wiring layer 10, the first semiconductor chip C1, and the second semiconductor chip C2.

Therefore, the heat generated from the chips may be discharged to both sides by using the lower surface of the exposed first semiconductor chip C1 and second semiconductor chip C2 and the through-window portion W.

Also, for example, as shown in FIG. 1, when a double-sided cooling power module package 1000 described later is mounted using a soldering process or a reflow process instead of the wiring process, in order to be mounted in a solder preform form, a solder S or solder paste may be applied to at least a portion of the solder pad P2, the wiring layer 10 and the first semiconductor chip C1 or the second semiconductor chip C2.

Therefore, by integrating a plurality of semiconductor chips into a single module, it is possible to reduce the number of components in mounting and reduce the mounting time and the mounting cost. In addition, since a separate jig is not required for each mounting step, the time and manpower consumed for installing or stacking the jig may be reduced and the integration module may be protected in a package form to improve the durability and strength of the product. Further, since the integration module, which is verified in the form of a package, may be finally assembled, productivity may be increased by improving module assembly yield, and wiring layers or metal layers on the chips may dissipate thermal and physical stresses. Moreover, it is possible to prevent the short-circuit phenomenon and the parasitic inductance by the existing wire, thereby improving the switching efficiency, and it is possible to improve thermal resistance characteristics by using an integral spacer.

FIGS. 2 to 7 are cross-sectional views illustrating steps of manufacturing a power chip integration module 100 according to some embodiments of the present invention.

Figure 2:
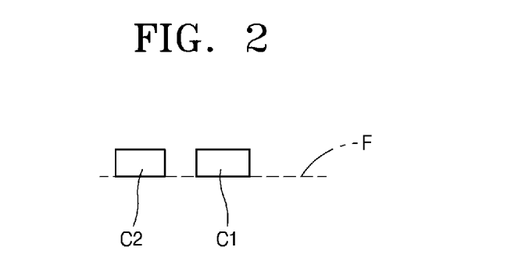
FIG. 2, FIG. 3, FIG. 4, FIG. 5, FIG. 6, and FIG. 7 are cross-sectional views illustrating steps of manufacturing a power chip integration module according to some embodiments of the present invention.

As shown in FIGS. 2 to 7, when describing the manufacturing process of the power chip integration module 100 according to some embodiments of the present invention, first, as shown in FIG. 2, the first semiconductor chip C1 and the second semiconductor chip C2 may be disposed on the installation surface F.

At this time, the installation surface F may be provided with a temporary substrate, a release paper, carrier tape or the like to easily remove and mount them later, and although not shown in the drawing, the first semiconductor chip C1 and the second semiconductor chip C2 may be disposed on a lower surface wiring layer.

Figure 3:
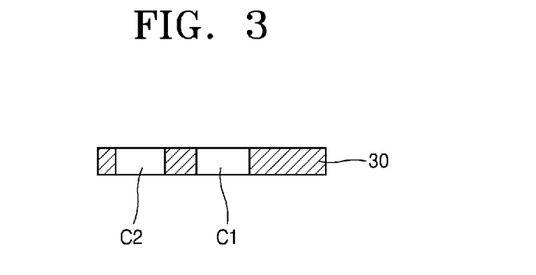

Next, as shown in FIG. 3, a portion of the first molding member 30 may be firstly molded in a shape surrounding the side surfaces of the first semiconductor chip C1 and the second semiconductor chip C2. At this time, the upper surfaces of the first semiconductor chip C1 and the second semiconductor chip C2 may be exposed.

Figure 4:
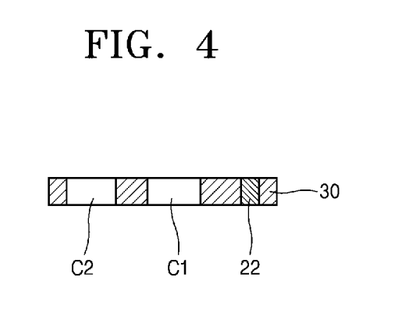

Next, as shown in FIG. 4, the vertical portion 22 of the internal electrode may be formed by perforating the portion of the molded first molding member 30 through etching or laser drilling and using various metal processes such as plating or sputtering or through-hole electrode process on the perforated part.

Figure 5:
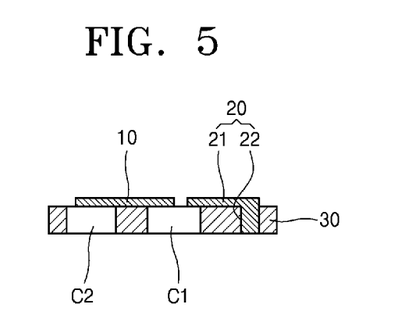

Next, as shown in FIG. 5, the horizontal portion 21 of the internal electrode 20 is formed so as to be connected to the vertical portion 22 by using various metal processes or thick metal processes, and at the same time, the wiring layer 10 for electrically connecting the upper surface of the first semiconductor chip C1 and the upper surface of the second semiconductor chip C2 may be formed using the same process.

Figure 6:
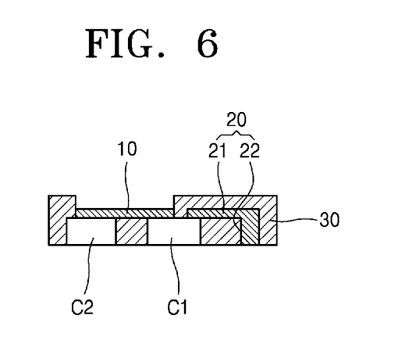

Next, as shown in FIG. 6, the first molding member 30 may be completed by secondarily molding the remaining portion of the first molding member 30 in a portion except the horizontal portion 21 of the internal electrode 20 and the heat transfer path.

Figure 7:
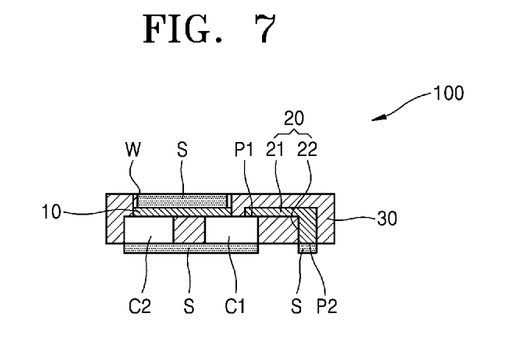

Next, as shown in FIG. 7, the solder S or solder paste is applied to at least a portion of the solder pad P2 exposed to the outside, the wiring layer 10 and the first semiconductor chip C1 or the second semiconductor chip C2.

Therefore, it is possible to prevent the chips from being damaged in the process of separating an additional jig or a jig, and although one product is illustrated in the drawing, mass production in a strip form is possible, thereby greatly improving productivity and yield.

Figure 8:
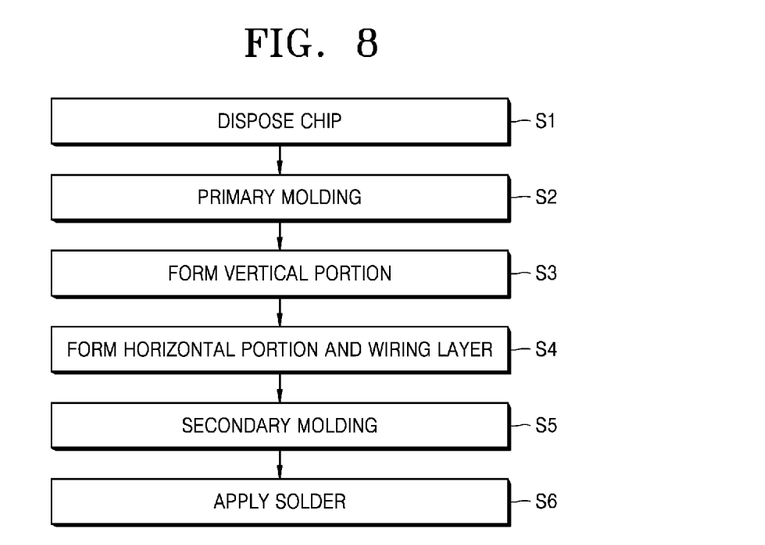
FIG. 8 is a flowchart illustrating a method of manufacturing a power chip integration module according to some embodiments of the present invention.

FIG. 8 is a flowchart illustrating a method of manufacturing a power chip integration module 100 according to some embodiments of the present invention.

As shown in FIGS. 1 to 8, a method of manufacturing a power chip integration module 100 according to some embodiments of the present invention includes step S1 of disposing a first semiconductor chip C1 and a second semiconductor chip C2 on an installation surface F, step S2 of primarily molding a portion of the first molding member 30 in a shape surrounding the side surfaces of the first semiconductor chip C1 and the second semiconductor chip C2, step S3 of forming a vertical portion 22 of the internal electrode by perforating the portion of the molded first molding member 30 and using a metal process on the perforated portion, step S4 of forming a horizontal portion 21 of the internal electrode 20 so as to be connected to the vertical portion 22 and forming a wiring layer 10 for electrically connecting an upper surface of the first semiconductor chip C1 and an upper surface of the second semiconductor chip C2, step S5 of secondarily molding the remaining portion of the first molding member 30 except the horizontal portion 21 of the internal electrode 20 and the heat transfer path, and step S6 of applying a solder S or solder paste to at least a portion of the solder pad P2 exposed to the outside and the wiring layer 10 and the first semiconductor chip C1 or the second semiconductor chip C2.

Figure 9:
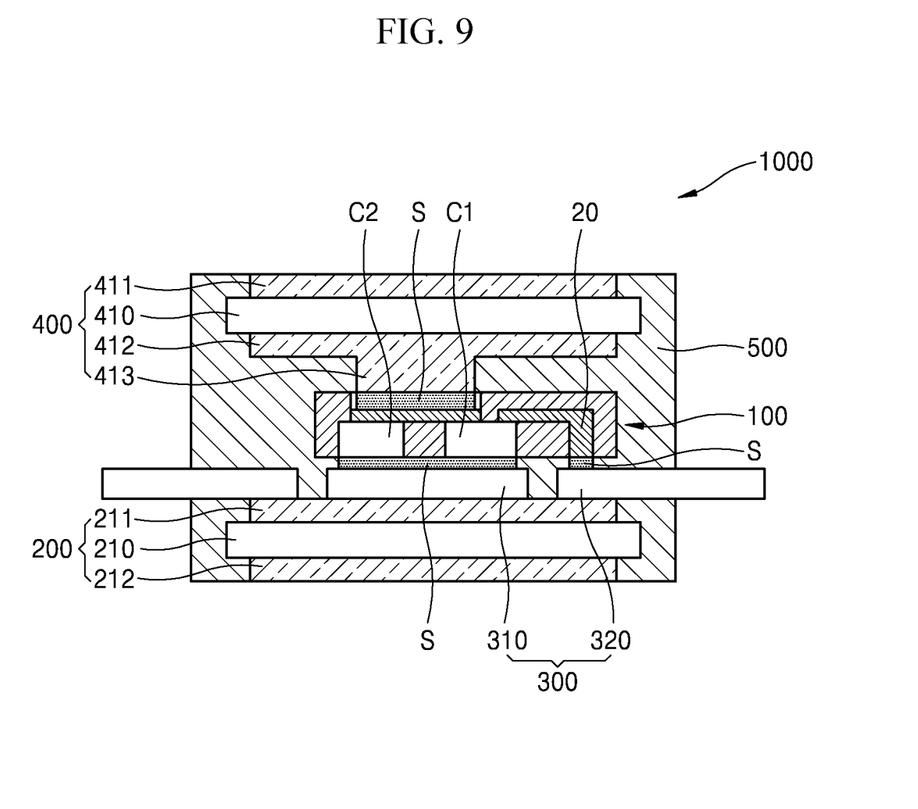
FIG. 9 is a cross-sectional view illustrating a double-sided cooling power module package according to some embodiments of the present invention.

FIG. 9 is a cross-sectional view illustrating a double-sided cooling power module package 1000 according to some embodiments of the present invention.

As shown in FIG. 9, the double-sided cooling power module package 1000 according to some embodiments of the present invention may include a lower substrate 200, a lead frame 300 disposed on the lower substrate 200, a power chip integration module 100 disposed on the lead frame 300 and integrated with the first semiconductor chip C1 and the second semiconductor chip C2 to enable soldering without wiring, an upper substrate 400 disposed on the power chip integration module 100, and a second molding member 500 disposed between the lower substrate 200 and the upper substrate 400.

Here, the power chip integration module 100 may have the same configuration and role as the power chip integration module 100 described with reference to FIGS. 1 to 8. Therefore, a detailed description will be omitted.

Also, for example, as shown in FIG. 9, the upper substrate 400 is a heat dissipation structure for discharging the heat generated on the upper surface of the power chip integration module 100 upward. More specifically, for example, the upper substrate 400 may include an upper insulating substrate 410, a first upper metal layer 411 disposed on the upper surface of the upper insulating substrate 410, a second upper metal layer 412 disposed on the lower surface of the upper insulating substrate 410, and a spacer portion 413 disposed between the second upper metal layer 412 and the power chip integration module 100.

Here, in order to improve the thermal resistance characteristics by reducing the boundary resistance, the second upper metal layer 412 and the spacer portion 413 may be integrally formed through an etching process (half etching or the like) so that the spacer portion 413 protrudes from the second upper metal layer 412.

More specifically, for example, the upper substrate 400 may be a Direct Bonded Copper (DBC) substrate where a copper (Cu) plate is disposed on the upper surface and the lower surface of a ceramic plate.

Also, for example, as shown in FIG. 9, the lead frame 300 may include a paddle portion 310 where the first semiconductor chip C1 and the second semiconductor chip C2 are seated, and a lead portion 320 electrically connected to the first semiconductor chip C1 and the second semiconductor chip C2 by the internal electrode 20 of the power chip integration module 100. Here, the paddle portion 310 may be omitted if necessary.

Therefore, as shown in FIG. 9, since the power chip integration module 100 already verified in the form of a package may be finally assembled on the lead frame 300, the module assembly yield may be improved and the productivity may be increased. Wiring layers or metal layers on the chips may dissipate thermal and physical stresses, and it is possible to prevent a wire short-circuit phenomenon or parasitic inductance by an existing wire, thereby improving the switching efficiency.

Meanwhile, as shown in FIG. 9, the lower substrate 200 is a heat dissipation structure that discharges heat generated from a lower surface of the power chip integration module 100 downward. The lower substrate 200 may include a lower insulating substrate 210, a first lower metal layer 211 disposed on the upper surface of the lower insulating substrate 210, and a second lower metal layer 212 disposed on the lower surface of the lower insulating substrate 210.

More specifically, for example, the lower substrate 200 may also be a Direct Bonded Copper (DBC) substrate where a copper (Cu) plate is disposed on the upper surface and the lower surface of a ceramic plate.

Figure 10:
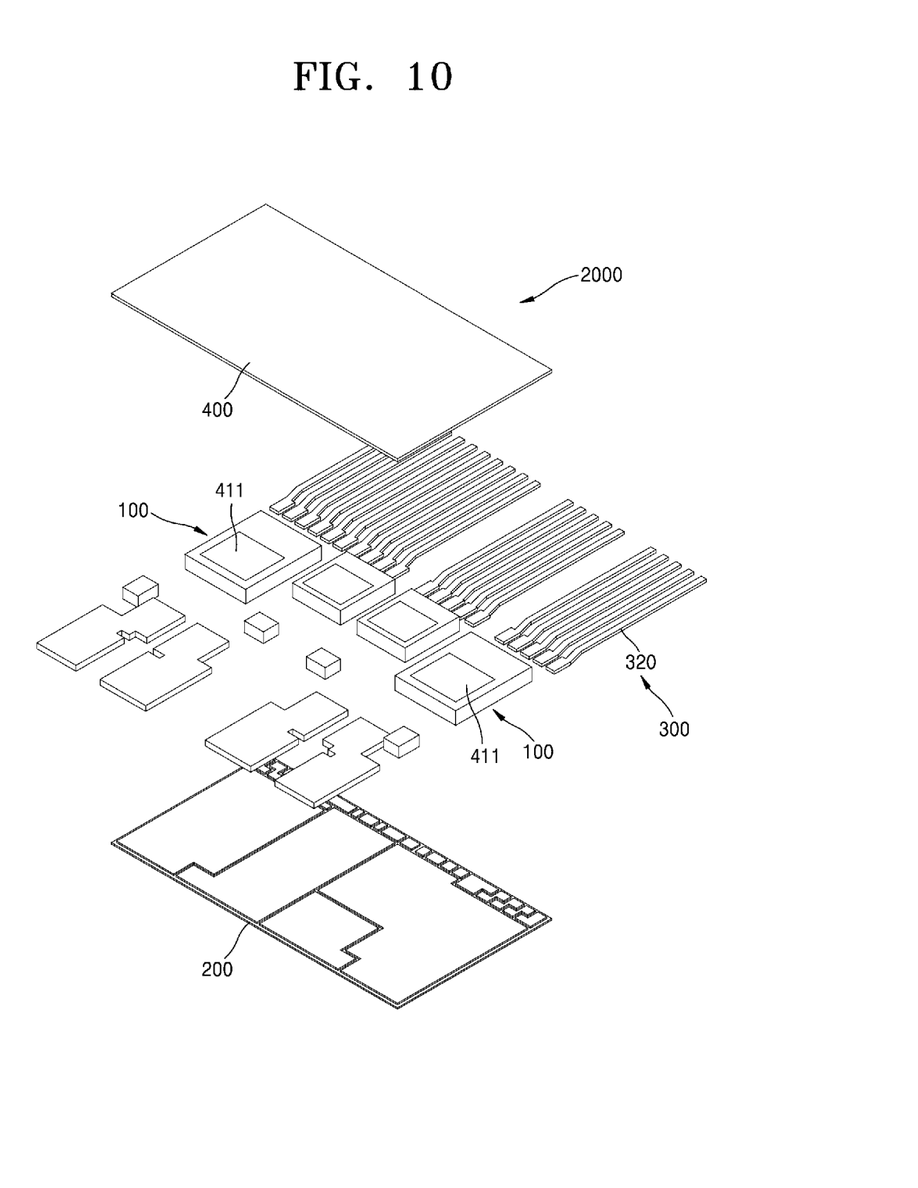
FIG. 10 is a cross-sectional view illustrating a double-sided cooling power module package according to some other embodiments of the present invention.
Figure 11:
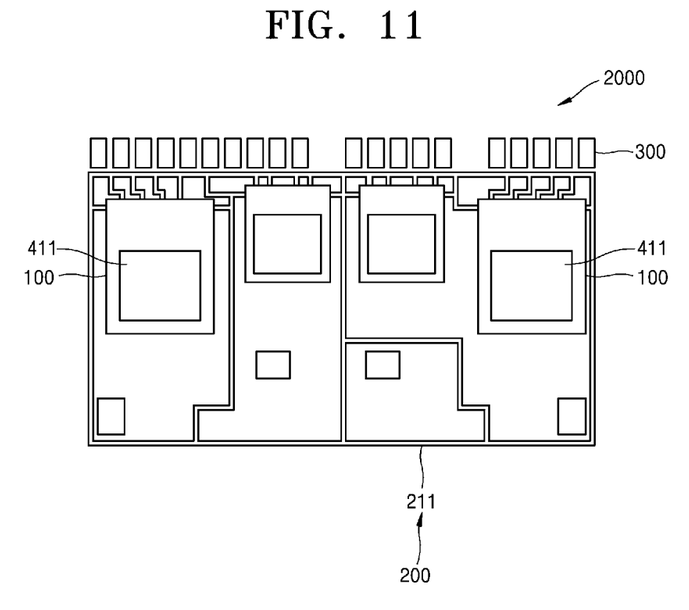
FIG. 11 is a plan view illustrating a power chip integration module of the double-sided cooling power module package of FIG. 10.

FIG. 10 is a cross-sectional view illustrating a double-sided cooling power module package 2000 according to some alternative embodiments of the present invention, and FIG. 11 is a plan view illustrating a power chip integration module 100 of a double-sided cooling power module package 2000 of FIG. 10.

As shown in FIGS. 10 to 11, in relation to the double-sided cooling power module package 2000 according to some other embodiments of the present invention, the first lower metal layer 211 may be patterned to correspond to the power chip integration module 100.

Therefore, the lead frame 300 is mounted on the lower substrate 200 using this pattern without a wiring process, and the power chip integration module 100 of the solder preform type described above is mounted on the lead frame 300. After the upper substrate 400 is mounted on the power chip integration module 100, the upper substrate 400 may be soldered using a reflow process or the like.

Therefore, it is possible to dissipate heat on both sides so that cooling efficiency is high, and soldering is firmly provided on the heat transfer path without any fragile parts such as wires so that mechanical, thermal, and electrical contact properties are excellent, thereby greatly improving the durability and strength of the product.

According to some embodiments of the present invention as described above, by integrating a plurality of semiconductor chips into a single module, it is possible to reduce the number of components in mounting and reduce the mounting time and the mounting cost. In addition, since a separate jig is not required for each mounting step, the time and manpower consumed for installing or stacking the jig may be reduced and the integration module may be protected in a package form to improve the durability and strength of the product. Further, since the integration module, which is verified in the form of a package, may be finally assembled, productivity may be increased by improving module assembly yield, and wiring layers or metal layers on the chips may dissipate thermal and physical stresses. Moreover, it is possible to prevent the short-circuit phenomenon and the parasitic inductance by the existing wire, thereby improving the switching efficiency, and it is possible to improve thermal resistance characteristics by using an integral spacer. Of course, the scope of the present invention is not limited by these effects.

Although the present invention has been described with reference to the embodiments shown in the drawings, it is only illustrative, and it will be understood by those skilled in the art that various changes and modifications may be made without departing from the scope of the present invention. Accordingly, the true scope of the present invention should be determined by the technical idea of the appended claims.

What is claimed is:

1. A power chip integration module comprising:
a first semiconductor chip;
a second semiconductor chip;
a wiring layer disposed on an upper surface or a lower surface of the first semiconductor chip and the second semiconductor chip to electrically connect the upper surfaces of the first semiconductor chip and the second semiconductor chip directly or the lower surfaces of the first semiconductor chip and the second semiconductor chip directly;
an internal electrode extending from an internal electrode pad on an upper surface of at least one of the wiring layer, the first semiconductor chip, the second semiconductor chip, and combinations thereof to an external solder pad formed on and coplanar with the lower surfaces of the first semiconductor chip and the second semiconductor chip; and
a first molding member in a shape to surround at least a portion of the first semiconductor chip, the second semiconductor chip, and the internal electrode.

2. The power chip integration module of claim 1, wherein the internal electrode comprises:
a horizontal portion disposed horizontally along an upper surface of any one of the wiring layer, the first semiconductor chip, and the second semiconductor chip; and
a vertical portion extending from the horizontal portion to the external solder pad in a vertical direction.

3. The power chip integration module of claim 1, wherein in order to serve as a heat transfer path above at least one of the wiring layer, the first semiconductor chip, the second semiconductor chip, and combinations thereof, the first molding member is provided with a through-window portion for exposing an upper surface of at least one of the wiring layer, the first semiconductor chip, and the second semiconductor chip.

4. The power chip integration module of claim 3, wherein a solder or a solder paste is applied to at least a portion of the external solder pad, the wiring layer, and the first semiconductor chip or the second semiconductor chip.

5. The power chip integration module of claim 1, wherein the first semiconductor chip is an insulated gate bipolar transistor (IGBT), and the second semiconductor chip is a diode.

6. A manufacturing method of a power chip integration module, the method comprising:
disposing a first semiconductor chip and a second semiconductor chip coplanar with a surface of the first semiconductor chip;
primarily molding a portion of a first molding member in a shape surrounding a side surface of the first semiconductor chip and the second semiconductor chip;
forming a vertical portion of an internal electrode by perforating the portion of the molded first molding member and using a metal process on the perforated portion;
forming a horizontal portion of the internal electrode so as to be connected to the vertical portion and forming a wiring layer for electrically connecting an upper surface of the first semiconductor chip and an upper surface of the second semiconductor chip directly;
secondarily molding a remaining portion of the first molding member except the horizontal portion of the internal electrode and a heat transfer path; and
applying a solder or a solder paste to at least a portion of the wiring layer and an external solder pad formed on a bottom of the vertical portion of the internal electrode and exposed to the outside.

7. A double-sided cooling power module package comprising:
a lower substrate;
a lead frame disposed on the lower substrate;
a power chip integration module disposed on a lead frame and integrated with a first semiconductor chip and a second semiconductor chip to enable soldering without wiring;
an upper substrate disposed on the power chip integration module; and
a first molding member disposed between the lower substrate and the upper substrate,
wherein the power chip integration module comprises:
the first semiconductor chip;
the second semiconductor chip;
a wiring layer disposed on an upper surface or a lower surface of the first semiconductor chip and the second semiconductor chip to electrically connect the first semiconductor chip and the second semiconductor chip;
an internal electrode extending from an internal electrode pad on an upper surface of at least one of the wiring layer, the first semiconductor chip, the second semiconductor chip, and combinations thereof to an external solder pad coplanar with the lower surfaces of the first semiconductor chip and the second semiconductor chip; and a second molding member in a shape to surround at least a portion of the first semiconductor chip, the second semiconductor chip, and the internal electrode.

8. The double-sided cooling power module package of claim 7, wherein the upper substrate comprises:

an upper insulating substrate;

a first upper metal layer disposed on an upper surface of the upper insulating substrate;

a second upper metal layer disposed on a lower surface of the upper insulating substrate; and a spacer portion disposed between the second upper metal layer and the power chip integration module.

9. The double-sided cooling power module package of claim 8, wherein the second upper metal layer and the spacer portion are integrally formed through an etching process so that the spacer portion protrudes from the second upper metal layer.

10. The double-sided cooling power module package of claim 7, wherein the lead frame comprises:

a paddle portion on which the first semiconductor chip and the second semiconductor chip are mounted; and a lead portion electrically connected to the first semiconductor chip and the second semiconductor chip by the internal electrode of the power chip integration module.

11. The double-sided cooling power module package of claim 10, wherein the lower substrate comprises:

a lower insulating substrate;

a first lower metal layer disposed on an upper surface of the lower insulating substrate; and a second lower metal layer disposed on a lower surface of the lower insulating substrate, wherein the first lower metal layer is patterned to correspond to the power chip integration module.

* * * * *